US012148707B2

(12) United States Patent
Zhou et al.

(10) Patent No.: US 12,148,707 B2
(45) Date of Patent: Nov. 19, 2024

(54) HOMOGENEOUS CHIPLETS CONFIGURABLE AS A TWO-DIMENSIONAL SYSTEM OR A THREE-DIMENSIONAL SYSTEM

(71) Applicant: Microsoft Technology Licensing, LLC, Redmond, WA (US)

(72) Inventors: Haohua Zhou, Fremont, CA (US); Xiaoling Xu, Cupertino, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 389 days.

(21) Appl. No.: 17/728,761

(22) Filed: Apr. 25, 2022

(65) Prior Publication Data

US 2023/0343718 A1 Oct. 26, 2023

(51) Int. Cl.
| | |
|---|---|
| *H01L 23/538* | (2006.01) |
| *H01L 23/00* | (2006.01) |
| *H01L 25/065* | (2023.01) |

(52) U.S. Cl.
CPC ...... *H01L 23/5386* (2013.01); *H01L 23/5385* (2013.01); *H01L 24/16* (2013.01);
(Continued)

(58) Field of Classification Search
CPC ..... H01L 2924/1431; H01L 2924/1436; H01L 2924/1437; H01L 25/0657; H01L 25/0652; H01L 2224/08145; H01L 2225/06503; H01L 2225/06541; G11C 5/025; G11C 8/12; G06F 15/7839; G06F 15/7842;
(Continued)

(56) References Cited

U.S. PATENT DOCUMENTS

| | | | |
|---|---|---|---|
| 2012/0146207 A1* | 6/2012 | Chou | .......... H01L 23/3675 |
| | | | 438/107 |
| 2014/0085959 A1 | 3/2014 | Saraswat et al. | |
| | | (Continued) | |

OTHER PUBLICATIONS

Hou, et al., "Wafer-Level Integration of an Advanced Logic-Memory System Through the Second-Generation CoWoS Technology", In Journal of IEEE Transactions on Electron Devices, vol. 64, Issue 10, Oct. 2017, pp. 4071-4077.

(Continued)

*Primary Examiner* — Victor A Mandala
*Assistant Examiner* — Lawrence C Tynes, Jr.
(74) *Attorney, Agent, or Firm* — Ranjeev Singh; Singh Law, PLLC (57) ABSTRACT

Homogeneous chiplets configurable both as a two-dimensional system or a three-dimensional system are described. An example chiplet system has a first homogeneous chiplet (HC) including a first integrated circuit (IC) die having a first logic block and a first memory that are interconnected via a first path for transfer of data signals between the first logic block and the first memory block. A second HC including a second IC die having a second logic block and a second memory block, interconnected via a second path for transfer of data signals between the second logic block and the second memory block, is stacked vertically on top of the first HC to provide a third path for transfer of data signals between the first logic block and the second memory block and a fourth path for transfer of data signals between the second logic block and the first memory block.

20 Claims, 6 Drawing Sheets

(52) U.S. Cl.
CPC ...... *H01L 25/0657* (2013.01); *H01L 2224/16146* (2013.01); *H01L 2224/16235* (2013.01); *H01L 2924/1431* (2013.01); *H01L 2924/1436* (2013.01); *H01L 2924/1437* (2013.01)

(58) Field of Classification Search
CPC ............. G06F 15/8007; G06F 15/8015; G06F 15/8023; G06F 15/803; G06F 15/8092; G06F 15/8053; G06F 15/8038; G06F 15/8046
See application file for complete search history.

(56) References Cited

U.S. PATENT DOCUMENTS

| | | |
|---|---|---|
| 2021/0375767 A1 | 12/2021 | Ho et al. |
| 2022/0037288 A1 | 2/2022 | Zhou et al. |

OTHER PUBLICATIONS

"International Search Report and Written Opinion Issued in PCT Application No. PCT/US2023/012650", Mailed Date: Jun. 21, 2023, 9 Pages.

* cited by examiner

HOMOGENEOUS CHIPLETS CONFIGURABLE AS A TWO-DIMENSIONAL SYSTEM OR A THREE-DIMENSIONAL SYSTEM

BACKGROUND

Traditional computing systems formed on silicon dies suffer from several problems. These problems result from power versus performance tradeoffs and other design and semiconductor technology constraints. At times, such computing systems can include silicon dies that are stacked on top of each other or are otherwise coupled via interposers and the like. Such arrangements continue to suffer from high design costs and poor performance. Accordingly, there is a need for improved structures for forming such computing systems.

SUMMARY

In one example, the present disclosure relates to a homogeneous chiplet system comprising a first homogeneous chiplet including a first integrated circuit die having a first logic block and a first memory block interconnected using a first on-die interconnect structure to provide a first path for transfer of data signals between the first logic block and the first memory block. The homogeneous chiplet system may further include a second homogeneous chiplet including a second integrated circuit die having a second logic block and a second memory block interconnected using a second on-die interconnect structure to provide a second path for transfer of data signals between the second logic block and the second memory block, where the second homogeneous chiplet is stacked vertically on top of the first homogeneous chiplet, and where the first logic block and the second memory block are arranged in a manner such that a first set of vertical die-to-die interconnection structures coupling the first logic block and the second memory block are configured to provide a third path for transfer of data signals between the first logic block and the second memory block, and where the second logic block and the first memory block are arranged in a manner such that a second set of vertical die-to-die interconnection structures coupling the second logic block and the first memory block are configured to provide a fourth path for transfer of data signals between the second logic block and the first memory block.

In another example, the present disclosure relates to a homogeneous chiplet system comprising a first homogeneous chiplet including a first integrated circuit die having a first logic block and a first memory block interconnected using a first on-die interconnect structure to provide a first path for transfer of data signals between the first logic block and the first memory block. The homogeneous chiplet system may further include a second homogeneous chiplet including a second integrated circuit die having a second logic block and a second memory block interconnected using a second on-die interconnect structure to provide a second path for transfer of data signals between the second logic block and the second memory block, where the second homogeneous chiplet is stacked vertically on top of the first homogeneous chiplet, and where the first logic block and the second memory block are arranged in a manner such that a first set of vertical die-to-die interconnection structures coupling the first logic block and the second memory block are configured to provide a third path for transfer of data signals between the first logic block and the second memory block, and where the second logic block and the first memory block are arranged in a manner such that a second set of vertical die-to-die interconnection structures coupling the second logic block and the first memory block are configured to provide a fourth path for transfer of data signals between the second logic block and the first memory block.

The first path has a first expected latency associated with the transfer of data signals between the first logic block and the first memory block, where the third path has a second expected latency associated with the transfer of data signals between the first logic block and the second memory block, where the first expected latency is greater than the second expected latency, where the second path has a first expected latency associated with the transfer of data signals between the second logic block and the second memory block, where the fourth path has a second expected latency associated with the transfer of data signals between the second logic block and the first memory block, and where the first expected latency is greater than the second expected latency.

In another example, the present disclosure relates to a homogeneous chiplet system comprising a first homogeneous chiplet including a first integrated circuit die having a first logic block and a first memory block interconnected using a first on-die interconnect structure to provide a first path for transfer of data signals between the first logic block and the first memory block. The homogeneous chiplet system may further include a second homogeneous chiplet including a second integrated circuit die having a second logic block and a second memory block interconnected using a second on-die interconnect structure to provide a second path for transfer of data signals between the second logic block and the second memory block, where the second homogeneous chiplet is stacked vertically on top of the first homogeneous chiplet, and where the first logic block and the second memory block are arranged in a manner such that a first set of vertical die-to-die interconnection structures coupling the first logic block and the second memory block are configured to provide a third path for transfer of data signals between the first logic block and the second memory block, and where the second logic block and the first memory block are arranged in a manner such that a second set of vertical die-to-die interconnection structures coupling the second logic block and the first memory block are configured to provide a fourth path for transfer of data signals between the second logic block and the first memory block.

The first path has a first expected latency associated with the transfer of data signals between the first logic block and the first memory block, where the third path has a second expected latency associated with the transfer of data signals between the first logic block and the second memory block, where the first expected latency is greater than the second expected latency, where the second path has a first expected latency associated with the transfer of data signals between the second logic block and the second memory block, where the fourth path has a second expected latency associated with the transfer of data signals between the second logic block and the first memory block, where the first expected latency is greater than the second expected latency. Each of the first homogeneous chiplet and second homogeneous chiplet is configured as a through silicon via (TSV)-aware chiplet allowing for both face-to-face and face-to-back coupling between the first homogeneous chiplet and second homogeneous chiplet.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

FIG. 1 shows a diagram of an example homogeneous chiplet.

DETAILED DESCRIPTION

Examples described in this disclosure relate to homogeneous chiplets configurable both as a two-dimensional system or a three-dimensional system. The use of the same homogeneous chiplet as part of either the two-dimensional system or the three-dimensional system may advantageously lower design and manufacturing costs. Certain examples relate to vertically stacked homogeneous chiplets. Other examples relate to horizontally-coupled homogeneous chiplets. In some cases, the homogeneous chiplets may be both vertically stacked and horizontally coupled. In certain examples, each homogeneous chiplet may include one or more of specific functionalities that are arranged symmetrically. The symmetric arrangement of the functionalities may allow for the use of the same homogeneous chiplet for arrangement as a two-dimensional structure or a three-dimensional structure. As an example, each homogeneous chiplet for arrangement as a two-dimensional structure or a three-dimensional structure may include a logic portion and a memory portion (e.g., a static random access memory (SRAM) portion). The term "homogeneous chiplet" as used herein refers to chiplets that are similar in structure and make such that they can be used as part of either a two-dimensional structure or a three-dimensional structure without requiring significant modifications to the design of the chiplets. A homogeneous chiplet system is a system that includes at least two such homogeneous chiplets.

Figure 1:
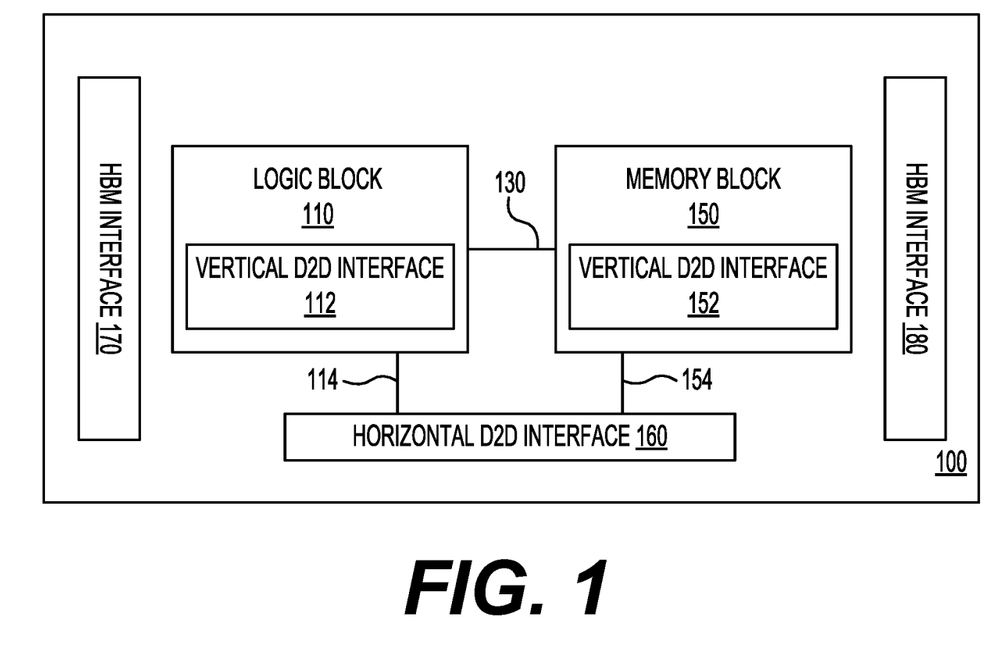

FIG. 1 shows a diagram of an example homogeneous chiplet (HC) 100. HC 100 may include a logic block 110 and a memory block 150. In this example, HC 100 may be formed of a single die, and thus HC 100 comprises only one integrated circuit die. Alternatively, HC 100 may include additional integrated circuit dies. Logic block 100 may comprise of one or more cores or other types of processing logic. Memory block 150 may comprise a memory array or several banks of memory arrays. The memory arrays may be implemented as static random access memory (SRAM) arrays. In addition, each SRAM may be implemented as a 2-port SRAM allowing for simultaneous read/write operations. Other memory technologies may also be used. Logic block 110 and memory block 150 may be coupled via an on-die interconnection structure 130. On-die interconnection structure 130 may be implemented as a bus system or a network-on-chip (NOC) interconnect system. As part of the die for HC 100, such a bus system or NOC interconnect system may be implemented using various conductive and insulating layers (e.g., metal layers and dielectric layers). Logic block 110 may further include a vertical D2D interface 112 and memory block 150 may include a similar vertical D2D interface 152. Each of vertical D2D interfaces 112 and 152 may be configurable to allow the formation of vertical die-to-die interconnection with another die. These die-to-die interconnections may allow high-speed access by a logic block located on one die to a memory block located on another die. The second die may be vertically stacked over the first die, horizontally coupled to the first die (e.g., via horizontal D2D interface 160), and could be combined with additional dies both in a vertical direction and a horizontal direction.

With continued reference to FIG. 1, HC 100 may further include two high-bandwidth memory (HBM) interfaces (e.g., HBM interface 170 and HBM interface 180). HBM interface 170 and HBM interface 180 may provide a chiplet-to-chiplet (C2C) interface. High speed PHYs included in these interfaces may allow HC 100 to be coupled with other chiplets. In addition, any of these interfaces may allow HC 100 to be connected with an HBM base die, which in turn may be connected to several memory (e.g., DRAM) dies. Either HBM interface 170 or HBM interface 180 may be coupled to the base die using a silicon interposer. Either HBM interface 170 or HBM interface 180 may receive memory commands (e.g., DRAM commands) from memory controller(s) associated with logic block 110 and pass them along to the DRAM supported by the base die. In another example, only one of the HBM interfaces may be implemented.

Each homogeneous chiplet may also be through silicon via (TSV)-aware in that each such chiplet may include through silicon vias that can be exposed to enable attachment to another homogeneous chiplet. As an example, the TSVs may be exposed by grinding or otherwise removing a layer of encapsulant and then using bumps or other interconnection structures to connect the chiplets. Two or more HC 100 may be arranged as a two-dimensional structure or as a three-dimensional structure. The use of the same chiplet (e.g., HC 100) as part of either the two-dimensional structure or the three-dimensional structure may advantageously lower design and manufacturing costs. Although FIG. 1 shows a certain number of components of HC 100 arranged in a certain manner, there could be more or fewer number of components arranged differently. As an example, HC 100 may include one or more dies including central processing units (CPUs), application specific integrated circuits (ASICs), graphical processing units (GPUs), field programmable gate arrays (FPGAs), microcontrollers, I/O circuits, Ethernet PHYs, or other silicon IP. Moreover, although memory block 150 is described as an SRAM, memory block 150 may include any other types of memory that is low latency and can be interfaced with logic block 110.

Figure 2:
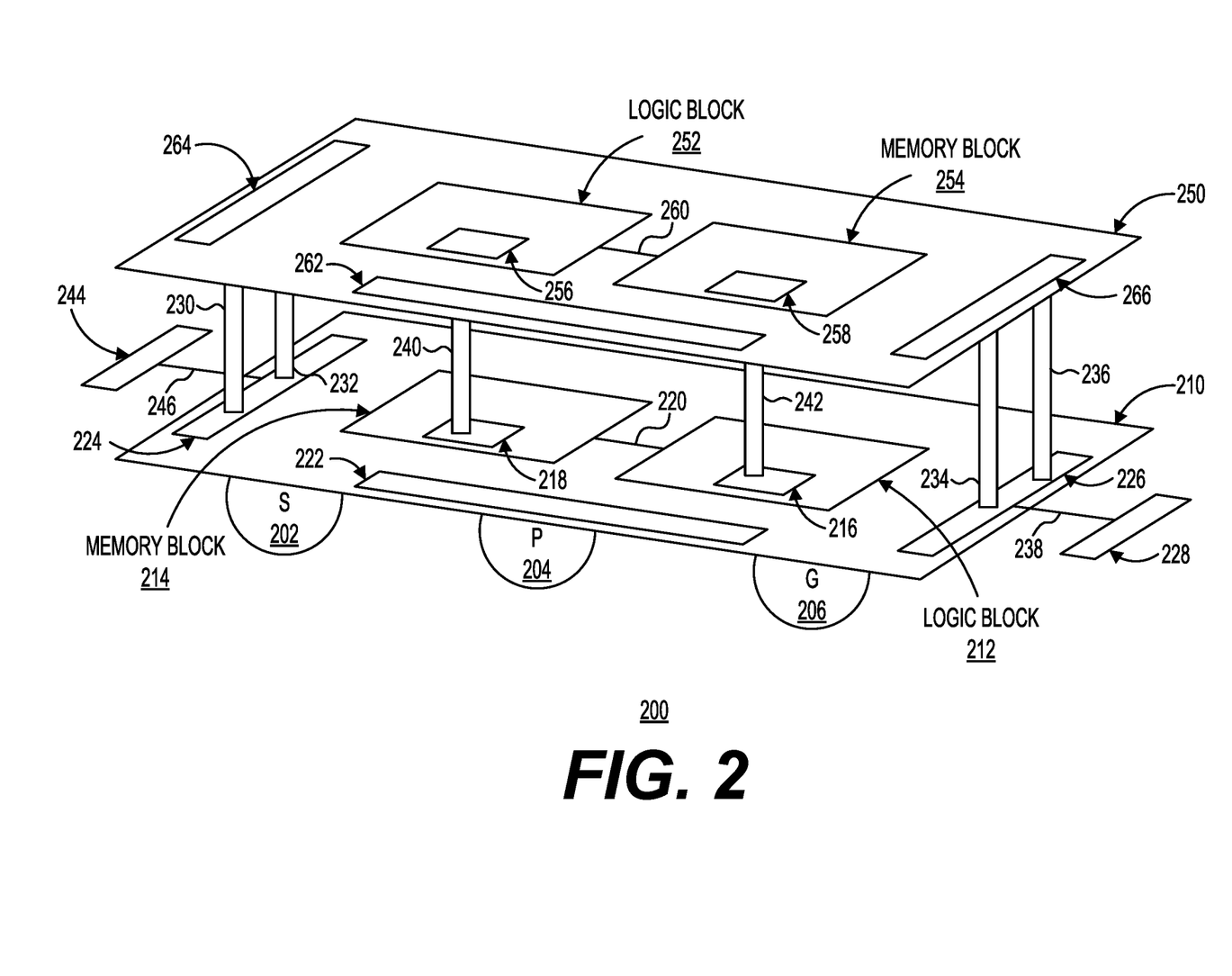
FIG. 2 shows a diagram of a homogeneous chiplet system including two vertically stacked homogeneous chiplets in accordance with one example.

FIG. 2 shows a diagram of a homogeneous chiplet system 200 including two vertically stacked homogeneous chiplets 210 and 250 in accordance with one example. Homogeneous chiplet system 200 may be coupled to the other external components via bumps 202, 204, and 206. Each of homogeneous chiplet (HC) 210 and homogeneous chiplet (HC) 250 may be implemented using HC 100 of FIG. 1. In this example, HC 210 and HC 250 are connected to each other in a face-to-face manner. As explained later with the example arrangement shown in FIG. 5, chiplets can also be connected to each other in a face-to-back manner. In the face-to-face arrangement, the active circuitry formed on the die associated with one chiplet faces the active circuitry formed on the die associated with the other chiplet. Active circuitry may be formed on the substrate associated with each die.

HC 210 may include a logic block 212 and a memory block 214. Logic block 212 may comprise of one or more cores or other types of processing logic. Memory block 214 may comprise a memory array or several banks of memory arrays. The memory arrays may be implemented as static random access memory (SRAM) arrays. In addition, each SRAM may be implemented as a 2-port SRAM allowing for simultaneous read/write operations via buffers. Other memory technologies may also be used. Logic block 212 and memory block 214 may be coupled via an on-die interconnection structure 220. On-die interconnection structure 220 may be implemented as a bus system or a network-on-chip (NOC) interconnect system. Logic block 212 may further include a vertical D2D interface 216 and memory block 214 may include a similar vertical D2D interface 218. Each of vertical D2D interfaces 216 and 218 may be configurable to allow the formation of vertical die-to-die interconnection structures. HC 210 may also include a horizontal D2D interface 222 for interconnecting this chiplet to another chiplet in a horizontal plane.

With continued reference to FIG. 2, HC 210 may further include two high-bandwidth memory (HBM) interfaces (e.g., HBM interface 224 and HBM interface 226). HBM interface 224 and HBM interface 226 may provide a chiplet-to-chiplet (C2C) interface. High speed PHYs included in these interfaces may allow HC 210 to be coupled with other chiplets. In addition, any of these interfaces may allow HC 210 to be connected with an HBM base die, which in turn may be connected to several memory (e.g., DRAM) dies. As an example, the coupling of HBM interface 224 with HBM interface 244, via a chiplet-2-chiplet (C2C) interconnection structure 244, may allow such a connection to a high bandwidth memory. HBM interface 224 may receive memory commands (e.g., DRAM commands) from memory controller(s) associated with logic block 252 and pass them along to the DRAM supported by the base die coupled via HBM interface 244. Similarly, the coupling of HBM interface 226 with HBM interface 228, via a chiplet-2-chiplet (C2C) interconnection structure 238, may allow such a connection to a high bandwidth memory. HBM interface 226 may receive memory commands (e.g., DRAM commands) from memory controller(s) associated with logic block 212 and pass them along to the DRAM supported by the base die (not shown) coupled via HBM interface 228.

Still referring to FIG. 2, homogeneous chiplet system 200 may further include a second homogeneous chiplet (HC 250) stacked on top of HC 210. HC 250 may include a logic block 252 and a memory block 254. Logic block 252 may comprise of one or more cores or other types of processing logic. Memory block 254 may comprise a memory array or several banks of memory arrays. The memory arrays may be implemented as static random access memory (SRAM) arrays. In addition, each SRAM may be implemented as a 2-port SRAM allowing for simultaneous read/write operations via buffers. Other memory technologies may also be used. Logic block 252 and memory block 254 may be coupled via an on-die interconnection structure 260. On-die interconnection structure 260 may be implemented as a bus system or a network-on-chip (NOC) interconnect system. Logic block 252 may further include a vertical D2D interface 256 and memory block 254 may include a similar vertical D2D interface 258. Each of vertical D2D interfaces 256 and 258 may be configurable to allow the formation of vertical die-to-die interconnection. HC 250 may also include a horizontal D2D interface 262 for interconnecting this chiplet to another chiplet in a horizontal plane.

With continued reference to FIG. 2, HC 250 may further include two high-bandwidth memory (HBM) interfaces (e.g., HBM interface 264 and HBM interface 266). HBM interface 264 and HBM interface 266 may provide a chiplet-to-chiplet (C2C) interface. High speed PHYs included in these interfaces may allow HC 250 to be coupled with other chiplets. In addition, any of these interfaces may allow HC 250 to be connected with an HBM base die, which in turn may be connected to several memory (e.g., DRAM) dies. HBM interface 224 may be coupled via interconnection structures 230 and 232 to HBM interface 264. Each of HBM interfaces 224, 226, 264, and 266 may be implemented as a combination PHY allowing for transfer of signals along both the horizontal direction and the vertical direction. Each HBM, however, may have active circuitry only with respect to those connections that are implemented. As an example, circuitry required for both horizontal and vertical interconnections may not be active. In other words, the HBM interface may be inactive with respect to PHY connections only in the horizontal direction, the vertical direction, or both the horizontal and the vertical directions.

Interconnection structures 230 and 232 may be used to couple any combination of various types of inputs/outputs to power, ground, and signal bumps 202, 204, and 206. HBM interface 226 may be coupled via interconnection structures 234 and 236 to HBM interface 266. Interconnection structures 234 and 236 may be used to couple any combination of various types of inputs/outputs to power, ground, and signal bumps 202, 204, and 206. Interconnection structures 230, 232, 234, 236, 240, and 242 may be formed using hybrid bumps. Such hybrid bumps may include metal to metal interconnection with a dielectric layer in-between. In one example, the metal to metal interconnection and the dielectric to dielectric interconnection are formed at room temperature.

Still referring to FIG. 2, in this example, vertical D2D interface 218 of HC 210 may be coupled via an interconnection structure 240 to vertical D2D interface 256 of HC 250. In this manner, logic block 252 can not only access memory block 254 via on-die interconnection structure 260 but also access memory block 214 via interconnection structure 240. In one example, interconnection structure 240 may be implemented using hybrid bumps (or similar interconnection structures) resulting in a significantly shorter physical distance between logic block 252 and memory block 214 as compared with the physical distance between logic block 252 and memory block 254 (interconnected via on-die interconnection structure 260). The access by logic block 252 to memory block 254 via on-die interconnection structure 260 may comprise one path and may have an expected latency associated with the transfer of data signals (e.g., data being transferred from memory block 254 to logic block 252). The latency may be measured in clock cycles or time. The access by logic block 252 to memory block 214 via interconnection structure 240 may comprise another path and may have a different expected latency associated with the transfer of data signals. In this example, because of the shorter physical distance between logic block 252 and memory block 214, the expected latency for the path through on-die interconnection structure 260 is greater than the expected latency for the path through interconnection structure 240. As a result, logic block 252 may be able to have a higher bandwidth and faster access to memory, allowing logic block 252 to execute data-intensive operations more efficiently, including operations such as neural network training and inference operations.

Moreover, in this example, vertical D2D interface 216 of HC 210 may be coupled via an interconnection structure 242 to vertical D2D interface 258 of HC 250. In this manner, logic block 212 can not only access memory block 214 via on-die interconnection structure 220 but also access memory block 254 via interconnection structure 242. In one example, interconnection structure 242 may be implemented using hybrid bumps (or similar interconnection structures) resulting in a significantly shorter physical distance between logic block 212 and memory block 254 as compared with the physical distance between logic block 212 and memory block 214 (interconnected via on-die interconnection structure 220). The access by logic block 212 to memory block 214 via on-die interconnection structure 220 may comprise one path and may have an expected latency associated with the transfer of data signals (e.g., data being transferred from memory block 214 to logic block 212). The latency may be measured in clock cycles or time. The access by logic block 212 to memory block 254 via interconnection structure 242 may comprise another path and may have a different expected latency associated with the transfer of data signals. In this example, because of the shorter physical distance between logic block 212 and memory block 254, the expected latency for the path through on-die interconnection structure 220 is greater than the expected latency for the path through interconnection structure 242. The access by logic block 212 to two different memory blocks 214 and 254 via these two different paths may advantageously increase the bandwidth associated with memory access operations. As a result, logic block 212 may be able to have a higher bandwidth and faster access to memory, allowing logic block 212 to execute data-intensive operations more efficiently, including operations such as neural network training and inference operations. The use of the same chiplet (e.g., HC 210 and HC 250) as part of a symmetric three-dimensional structure may advantageously lower design and manufacturing costs. The hybrid bumps (or other interconnection structures) used to connect logic block 212 with memory block 254 and to connect logic block 252 with memory block 214 may be arranged symmetrically along the y-axis. In sum, additional chiplets may be interconnected in a symmetric manner both along the x-axis and the y-axis. Although FIG. 2 shows a certain number of components of homogeneous chiplet system 200 arranged in a certain manner, there could be more or fewer number of components arranged differently. As an example, each of HC 210 and HC 250 may include one or more dies including central processing units (CPUs), application specific integrated circuits (ASICs), graphical processing units (GPUs), field programmable gate arrays (FPGAs), microcontrollers, I/O circuits, Ethernet PHYs, or other silicon IP.

Figure 3:
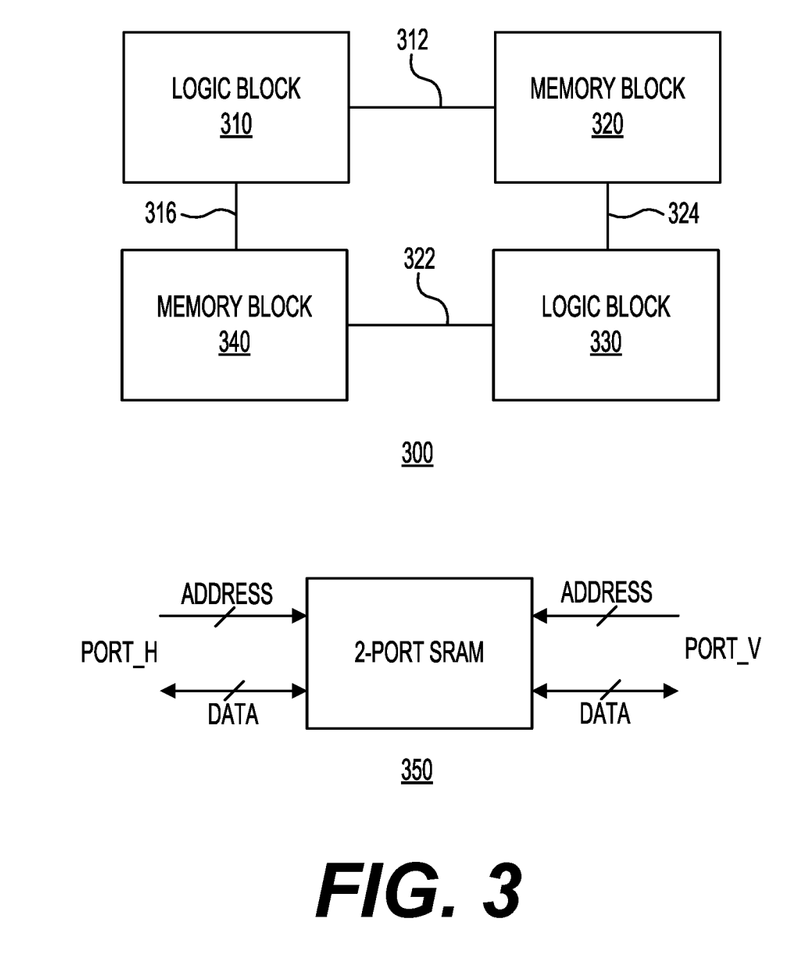
FIG. 3 shows a diagram of a symmetric arrangement of logic blocks and memory blocks with a 2-port SRAM for use in a homogeneous chiplet system in accordance with one example.

FIG. 3 shows a diagram of a symmetric arrangement 300 of logic blocks and memory blocks with a 2-port SRAM 350 for use in a homogeneous chiplet system in accordance with one example. Symmetric arrangement 300 may include logic block 310 coupled to memory block 320 via interconnection 312 and coupled to memory bock 340 via interconnection 316. Symmetric arrangement 300 may further include logic block 330 coupled to memory block 320 via interconnection 324 and coupled to memory bock 340 via interconnection 322. Logic block 310 and memory block 320 may be included in one homogeneous chiplet and logic block 330 and memory block 340 may be included in another homogeneous chiplet and the two homogeneous chiplets may form a homogeneous chiplet system. Each memory block may be implemented as a 2-port SRAM 350. 2-port SRAM 350 may include a horizontal port (PORT_H) and a vertical port (PORT_V). 2-port SRAM 350 may include a network-on-chip (NOC) for routing signals from a respective logic block to the SRAM decoders and for routing data from the memory cells back to the respective block. Each of these ports may allow access to data based on the addresses provided to the memory from the logic blocks. In this example, memory block 320, implemented as 2-port SRAM 350, may have the horizontal port (PORT_H) coupled via interconnection 312 to logic block 310, and it may have the vertical port (PORT_V) coupled via interconnection 324 to logic block 330. In this example, memory block 340, implemented as 2-port SRAM 350, may have the horizontal port (PORT_H) coupled via interconnection 322 to logic block 330, and it may have the vertical port (PORT_V) coupled via interconnection 316 to logic block 310.

Figure 4:
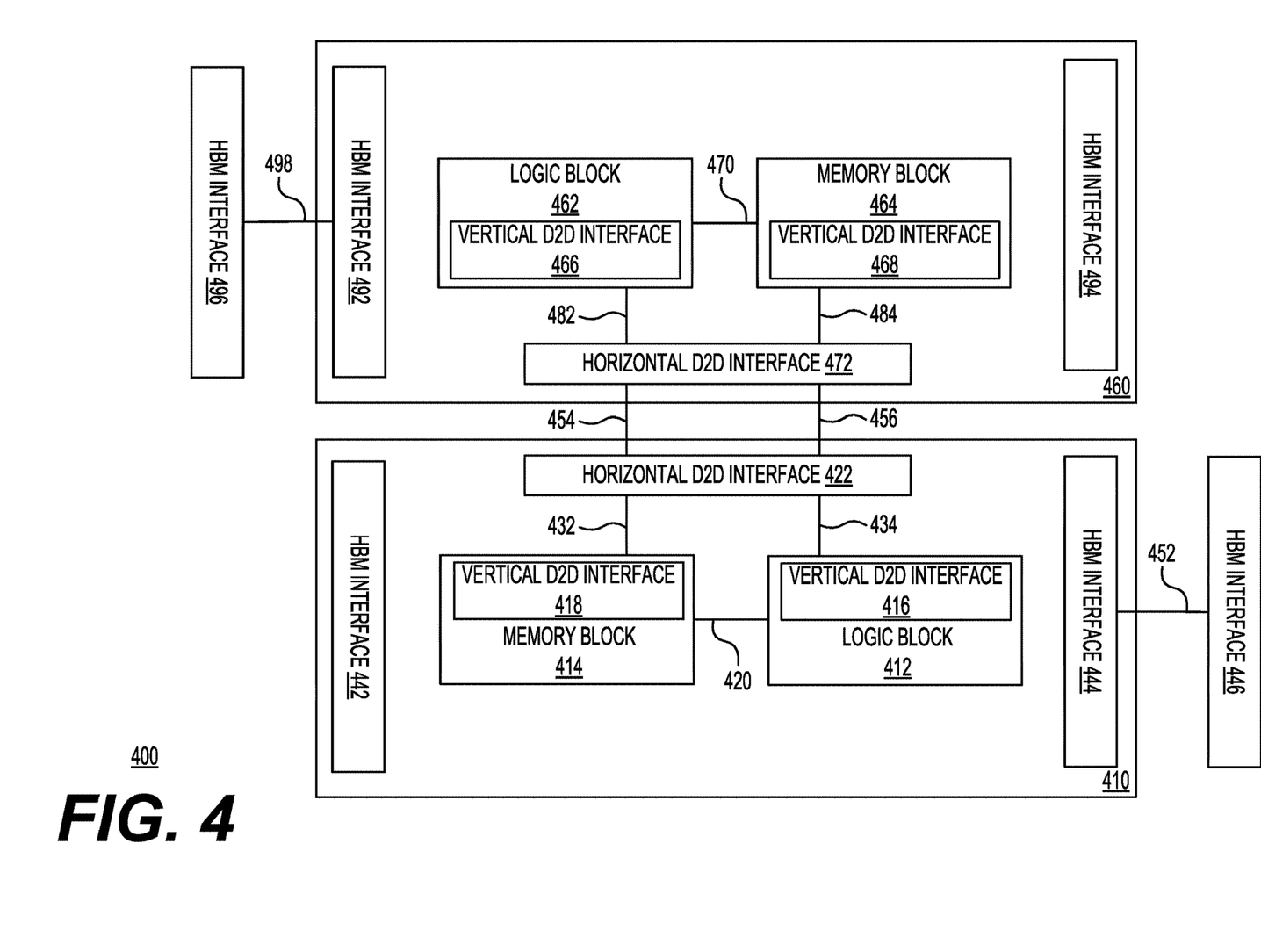
FIG. 4 shows a diagram of a homogeneous chiplet system including two horizontally coupled homogeneous chiplets in accordance with one example.

FIG. 4 shows a diagram of a homogeneous chiplet system 400 including two horizontally coupled homogeneous chiplets 410 and 460 in accordance with one example. Each of homogeneous chiplet (HC) 410 and homogeneous chiplet (HC) 460 may be implemented using HC 100 of FIG. 1. HC 410 may include a logic block 412 and a memory block 414. Logic block 412 may comprise of one or more cores or other types of processing logic. Memory block 414 may comprise a memory array or several banks of memory arrays. The memory arrays may be implemented as static random access memory (SRAM) arrays. In addition, each SRAM may be implemented as a 2-port SRAM allowing for simultaneous read/write operations via buffers. Other memory technologies may also be used. Logic block 412 and memory block 414 may be coupled via an on-die interconnection structure 420. On-die interconnection structure 420 may be implemented as a bus system or a network-on-chip (NOC) interconnect system. Logic block 412 may further include a vertical D2D interface 416 and memory block 414 may include a similar vertical D2D interface 418. Each of vertical D2D interfaces 416 and 418 may be configurable to allow the formation of vertical die-to-die interconnection. HC 410 may include a horizontal D2D interface 422 for interconnecting this chiplet to another chiplet in a horizontal plane.

With continued reference to FIG. 4, HC 410 may further include two high-bandwidth memory (HBM) interfaces (e.g., HBM interface 442 and HBM interface 444). HBM interface 442 and HBM interface 444 may provide a chiplet-to-chiplet (C2C) interface. High speed PHYs included in these interfaces may allow HC 410 to be coupled with other chiplets. In addition, any of these interfaces may allow HC 410 to be connected with an HBM base die, which in turn may be connected to several memory (e.g., DRAM) dies. As an example, the coupling of HBM interface 444 with HBM interface 446, via a chiplet-2-chiplet (C2C) interconnection structure 452, may allow such a connection to a high bandwidth memory. HBM interface 444 may receive memory commands (e.g., DRAM commands) from memory controller(s) associated with logic block 412 and pass them along to the DRAM supported by the base die coupled via HBM interface 446.

Still referring to FIG. 4, homogeneous chiplet system 400 may further include a second homogeneous chiplet (HC 460) coupled in a 2-D arrangement to HC 410. HC 460 may include a logic block 462 and a memory block 464. Logic block 462 may comprise of one or more cores or other types of processing logic. Memory block 464 may comprise a memory array or several banks of memory arrays. The memory arrays may be implemented as static random access memory (SRAM) arrays. In addition, each SRAM may be implemented as a 2-port SRAM allowing for simultaneous read/write operations via buffers. Other memory technologies may also be used. Logic block 462 and memory block 464 may be coupled via an on-die interconnection structure 470. On-die interconnection structure 470 may be implemented as a bus system or a network-on-chip (NOC) interconnect system. Logic block 462 may further include a vertical D2D interface 466 and memory block 464 may include a similar vertical D2D interface 468. Each of vertical D2D interfaces 466 and 468 may be configurable to allow the formation of vertical die-to-die interconnection. HC 460 may include a horizontal D2D interface 472 for interconnecting this chiplet to another chiplet in a horizontal plane.

With continued reference to FIG. 4, HC 460 may further include two high-bandwidth memory (HBM) interfaces (e.g., HBM interface 492 and HBM interface 494). HBM interface 492 and HBM interface 494 may provide a chiplet-to-chiplet (C2C) interface. High speed PHYs included in these interfaces may allow HC 460 to be coupled with other chiplets. In addition, any of these interfaces may allow HC 460 to be connected with an HBM base die, which in turn may be connected to several memory (e.g., DRAM) dies. As an example, the coupling of HBM interface 492 with HBM interface 496, via a chiplet-2-chiplet (C2C) interconnection structure 498, may allow such a connection to a high bandwidth memory. HBM interface 492 may receive memory commands (e.g., DRAM commands) from memory controller(s) associated with logic block 462 and pass them along to the DRAM supported by the base die coupled via HBM interface 496.

In this example, horizontal D2D interface 422 of HC 410 may be coupled via interconnection structures 454 and 456 to horizontal D2D interface 472 of HC 460. Logic block 412 may be coupled via on-die interconnection structure 434 to horizontal D2D interface 422 of HC 410. Memory block 414 may be coupled via on-die interconnection structure 432 to horizontal D2D interface 422 of HC 410. Similarly, logic block 462 may be coupled via on-die interconnection structure 482 to horizontal D2D interface 472 of HC 460. Memory block 464 may be coupled via on-die interconnection structure 484 to horizontal D2D interface 472 of HC 460. In this manner, logic block 412 can not only access memory block 414 via on-die interconnection structure 420 but also can access memory block 464 via on-die interconnection structure 434, horizontal D2D interface 422, interconnection structure 456, horizontal D2D interface 472, and interconnection structure 484. As a result, logic block 412 may be able to have access to additional memory (e.g., memory block 464 of HC 460), allowing logic block 412 to execute data-intensive operations more efficiently, including operations such as neural network training and inference operations. Moreover, in this example, logic block 462 can not only access memory block 464 via on-die interconnection structure 470 but also can access memory block 414 via on-die interconnection structure 482, horizontal D2D interface 472, interconnection structure 454, horizontal D2D interface 422, and interconnection structure 432. As a result, logic block 462 may be able to have access to additional memory (e.g., memory block 414 of HC 410) allowing logic block 462 to execute data-intensive operations more efficiently, including operations, such as neural network training and inference operations. The use of the same chiplet (e.g., HC 410 and HC 460) as part of a symmetric two-dimensional structure may advantageously lower design and manufacturing costs. Although FIG. 4 shows a certain number of components of homogeneous chiplet system 400 arranged in a certain manner, there could be more or fewer number of components arranged differently. As an example, HC 410 may include another horizontal D2D interface (similar to horizontal D2D interface 422) located on towards the bottom portion of HC 410, allowing HC 410 to be interconnected with additional homogeneous chiplets along the x-axis. Similarly, HC 460 may include another horizontal D2D interface (similar to horizontal D2D interface 472) located on towards the top portion of HC 460, allowing HC 460 to be interconnected with additional homogeneous chiplets along the x-axis. As another example, each of HC 410 and HC 460 may include one or more dies including central processing units (CPUs), application specific integrated circuits (ASICs), graphical processing units (GPUs), field programmable gate arrays (FPGAs), microcontrollers, I/O circuits, Ethernet PHYs, or other silicon IP.

Figure 5:
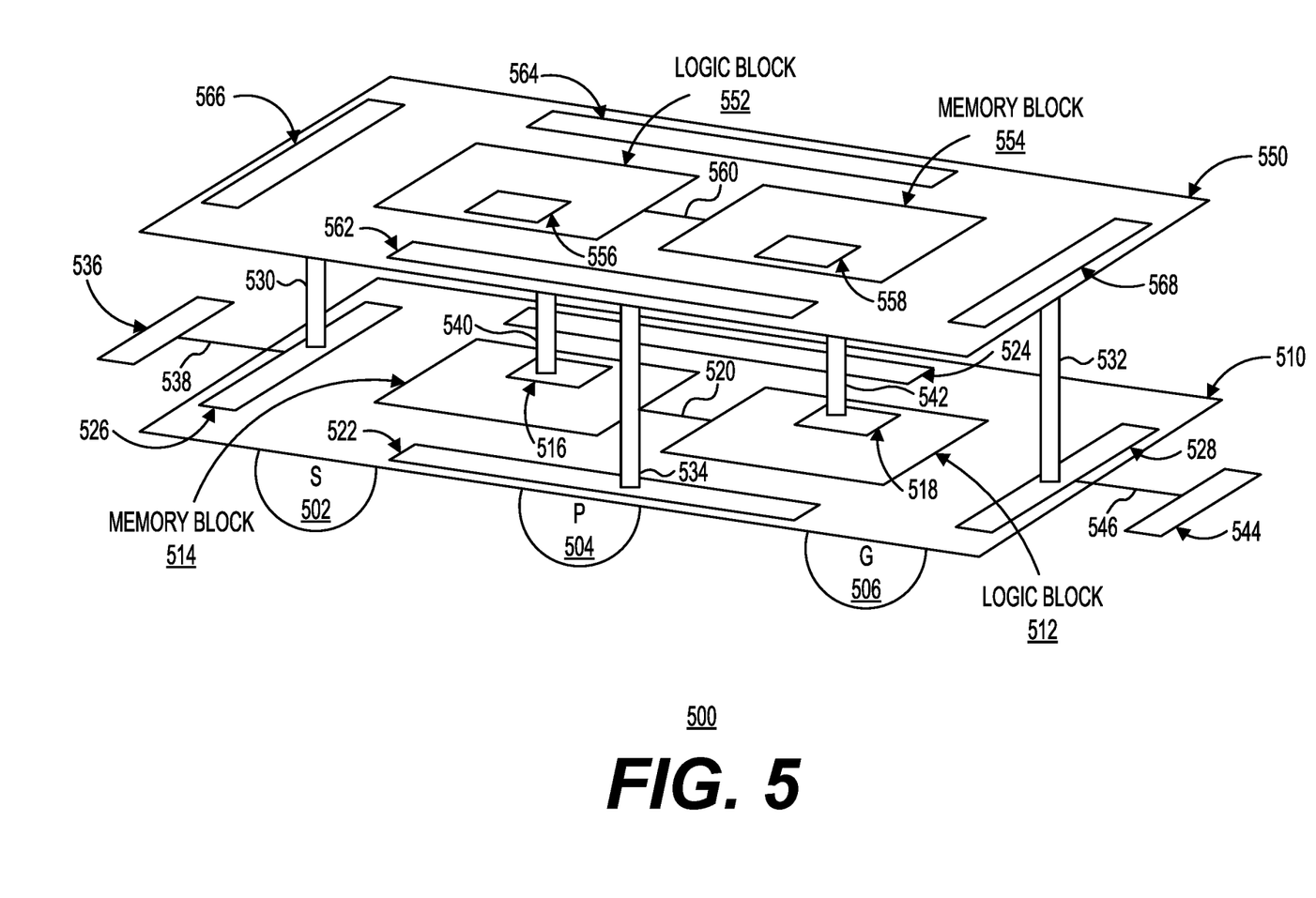
FIG. 5 shows a diagram of another homogeneous chiplet system including two vertically stacked homogeneous chiplets in accordance with one example.

FIG. 5 shows a diagram of another homogeneous chiplet system 500 including two vertically stacked homogeneous chiplets 510 and 550 in accordance with one example. Homogeneous chiplet system 500 may be coupled to the other external components via a silicon interposer via bumps 502, 504, and 506. Each of homogeneous chiplet (HC) 510 and homogeneous chiplet (HC) 550 may be implemented using HC 100 of FIG. 1. In this example, HC 510 and HC 550 are connected to each other in a face-to-back manner. As explained earlier with the example arrangement shown in FIG. 2, chiplets can also be connected to each other in a face-to-face manner. In the face-to-back arrangement, the active circuitry formed on the die associated with one chiplet faces the substrate side of the die associated with the other chiplet. Active circuitry may be formed on the substrate associated with each die. The same homogeneous chiplet (e.g., HC 100) when flipped may be used to attach in the face-to-back manner.

HC 510 may include a logic block 512 and a memory block 514. Logic block 512 may comprise of one or more cores or other types of processing logic. Memory block 514 may comprise a memory array or several banks of memory arrays. The memory arrays may be implemented as static random access memory (SRAM) arrays. In addition, each SRAM may be implemented as a 2-port SRAM allowing for simultaneous read/write operations via buffers. Other memory technologies may also be used. Logic block 512 and memory block 514 may be coupled via an on-die interconnection structure 520. On-die interconnection structure 520 may be implemented as a bus system or a network-on-chip (NOC) interconnect system. Logic block 512 may further include a vertical D2D interface 518 and memory block 514 may include a similar vertical D2D interface 516. Each of vertical D2D interfaces 516 and 518 may be configurable to allow the formation of vertical die-to-die interconnection structures. HC 510 may also include a horizontal D2D interface 522 and another horizontal D2D interface 524 for interconnecting this chiplet to another chiplet in a horizontal plane.

With continued reference to FIG. 5, HC 510 may further include two high-bandwidth memory (HBM) interfaces (e.g., HBM interface 526 and HBM interface 528). HBM interface 526 and HBM interface 528 may provide a chiplet-to-chiplet (C2C) interface. High speed PHYs included in these interfaces may allow HC 510 to be coupled with other chiplets. In addition, any of these interfaces may allow HC 510 to be connected with an HBM base die, which in turn may be connected to several memory (e.g., DRAM) dies. As an example, the coupling of HBM interface 526 with HBM interface 536, via a chiplet-2-chiplet (C2C) interconnection structure 538, may allow such a connection to a high bandwidth memory. HBM interface 526 may receive memory commands (e.g., DRAM commands) from memory controller(s) associated with logic block 512 and pass them along to the DRAM supported by the base die (not shown) coupled via HBM interface 536. Similarly, the coupling of HBM interface 528 with HBM interface 544, via a chiplet-2-chiplet (C2C) interconnection structure 546, may allow such a connection to a high bandwidth memory. HBM interface 528 may receive memory commands (e.g., DRAM commands) from memory controller(s) associated with logic block 552 and pass them along to the DRAM supported by the base die coupled via HBM interface 544.

Still referring to FIG. 5, homogeneous chiplet system 500 may further include a second homogeneous chiplet (HC 550) stacked on top of HC 510. HC 550 may include a logic block 552 and a memory block 554. Logic block 552 may comprise of one or more cores or other types of processing logic. Memory block 554 may comprise a memory array or several banks of memory arrays. The memory arrays may be implemented as static random access memory (SRAM) arrays. In addition, each SRAM may be implemented as a 2-port SRAM allowing for simultaneous read/write operations via buffers. Other memory technologies may also be used. Logic block 552 and memory block 554 may be coupled via an on-die interconnection structure 560. On-die interconnection structure 560 may be implemented as a bus system or a network-on-chip (NOC) interconnect system. Logic block 552 may further include a vertical D2D interface 556 and memory block 554 may include a similar vertical D2D interface 558. Each of vertical D2D interfaces 556 and 558 may be configurable to allow the formation of vertical die-to-die interconnection. HC 550 may also include a horizontal D2D interface 562 and a horizontal D2D interface 564 for interconnecting this chiplet to another chiplet in a horizontal plane.

With continued reference to FIG. 5, HC 550 may further include two high-bandwidth memory (HBM) interfaces (e.g., HBM interface 566 and HBM interface 568). HBM interface 566 and HBM interface 568 may provide a chiplet-to-chiplet (C2C) interface. High speed PHYs included in these interfaces may allow HC 550 to be coupled with other chiplets. In addition, any of these interfaces may allow HC 550 to be connected with an HBM base die, which in turn may be connected to several memory (e.g., DRAM) dies. HBM interface 526 may be coupled via interconnection structure 530 to HBM interface 566. HBM interface 528 may be coupled via interconnection structure 532 to HBM interface 568. Each of HBM interfaces 526, 528, 562, and 564 may be implemented as a combination PHY allowing for transfer of signals along both the horizontal direction and the vertical direction. Each HBM, however, may have active circuitry only with respect to those connections that are implemented. As an example, circuitry required for both horizontal and vertical interconnections may not be active. In other words, the HBM interface may be inactive with respect to PHY connections only in the horizontal direction, the vertical direction, or both the horizontal and the vertical directions.

Interconnection structures 530 and 532 may be used to couple any combination of various types of inputs/outputs to power, ground, and signal bumps 502, 504, and 506. Interconnection structure 534 may vertically interconnect horizontal D2D interface 522 with horizontal D2D interface 562. Interconnection structures 530, 532, 534, 540, and 542 may be formed using hybrid bumps. Such hybrid bumps may include metal to metal interconnection with a dielectric layer in-between. In one example, the metal to metal interconnection and the dielectric to dielectric interconnection are formed at room temperature.

Still referring to FIG. 5, in this example, vertical D2D interface 516 of HC 510 may be coupled via an interconnection structure 540 to vertical D2D interface 556 of HC 550. In this manner, logic block 552 can not only access memory block 554 via on-die interconnection structure 560 but also access memory block 514 via interconnection structure 540. In one example, interconnection structure 540 may be implemented using hybrid bumps (or similar interconnection structures) resulting in a significantly shorter physical distance between logic block 552 and memory block 514 as compared with the physical distance between logic block 552 and memory block 554 (interconnected via on-die interconnection structure 560). The access by logic block 552 to memory block 554 via on-die interconnection structure 560 may comprise one path and may have an expected latency associated with the transfer of data signals (e.g., data being transferred from memory block 554 to logic block 552). The latency may be measured in clock cycles or time. The access by logic block 552 to memory block 514 via interconnection structure 540 may comprise another path and may have a different expected latency associated with the transfer of data signals. In this example, because of the shorter physical distance between logic block 552 and memory block 514, the expected latency for the path through on-die interconnection structure 560 is greater than the expected latency for the path through interconnection structure 540. The access by logic block 512 to two different memory blocks 514 and 554 via these two different paths may advantageously increase the bandwidth associated with memory access operations. As a result, logic block 552 may be able to have a higher bandwidth and faster access to memory, allowing logic block 552 to execute data-intensive operations more efficiently, including operations such as neural network training and inference operations.

Moreover, in this example, vertical D2D interface 518 of HC 510 may be coupled via an interconnection structure 542 to vertical D2D interface 558 of HC 550. In this manner, logic block 512 can not only access memory block 514 via on-die interconnection structure 520 but also can access memory block 554 via interconnection structure 542. In one example, interconnection structure 542 may be implemented using hybrid bumps (or similar interconnection structures) resulting a significantly shorter physical distance between logic block 512 and memory block 554 as compared with the physical distance between logic block 512 and memory block 514 (interconnected via on-die interconnection structure 520). The access by logic block 512 to memory block 514 via on-die interconnection structure 520 may comprise one path and may have an expected latency associated with the transfer of data signals (e.g., data being transferred from memory block 514 to logic block 512). The latency may be measured in clock cycles or time. The access by logic block 512 to memory block 554 via interconnection structure 542 may comprise another path and may have a different expected latency associated with the transfer of data signals. In this example, because of the shorter physical distance between logic block 512 and memory block 554, the expected latency for the path through on-die interconnection structure 520 is greater than the expected latency for the path through interconnection structure 542. As a result, logic block 512 may be able to have a higher bandwidth and faster access to memory allowing logic block 512 to execute data-intensive operations more efficiently, including operations, such as neural network training and inference operations. The use of the same chiplet (e.g., HC 510 and HC 550)

as part of a symmetric three-dimensional structure may advantageously lower design and manufacturing costs. The hybrid bumps (or other interconnection structures) used to connect logic block 512 with memory block 554 and to connect logic block 552 with memory block 514 may be arranged symmetrically along the y-axis. In sum, additional chiplets may be interconnected in a symmetric manner both along the x-axis and the y-axis. Although FIG. 5 shows a certain number of components of homogeneous chiplet system 500 arranged in a certain manner, there could be more or fewer number of components arranged differently. As an example, each of HC 510 and HC 550 may include one or more dies including central processing units (CPUs), application specific integrated circuits (ASICs), graphical processing units (GPUs), field programmable gate arrays (FPGAs), microcontrollers, I/O circuits, Ethernet PHYs, or other silicon IP.

Figure 6:
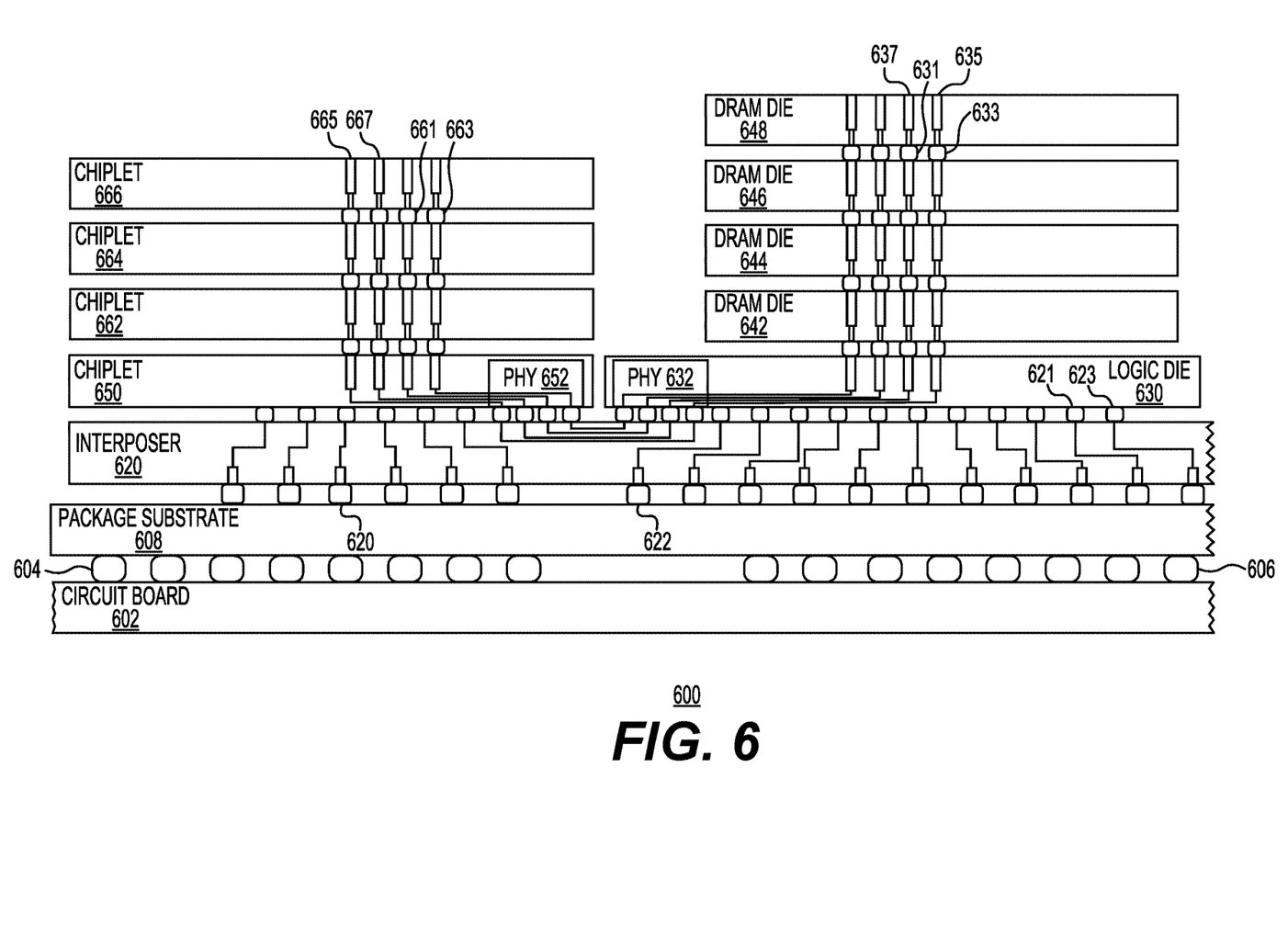
FIG. 6 shows a system having multiple homogeneous chiplets in accordance with one example.

FIG. 6 shows an example system 600 having multiple homogeneous chiplets in accordance with one example. System 600 may include vertically stacked homogeneous chiplets coupled to a high-bandwidth memory system. System 600 may include a circuit board 602. Circuit board 602 may be configured as a printed circuit board or a similar support structure for mounting package substrates on it. As an example, package substrate 608 with packaging balls 604 and 606 may be mounted on circuit board 602. An interposer 620 may be mounted on top of package substrate 608 using bumps (e.g., Cu bumps 620 and 622). Interposer 620 may further be connected to a stack of homogeneous chiplets and a high-bandwidth memory system using micro-bumps 621 and 623. Logic die 630 (e.g., a DRAM logic die) may be directly mounted on interposer 620 and memory dies, such as DRAM die 642, DRAM die 644, DRAM die 646, and DRAM die 648 may be stacked on top of logic die 630. Each DRAM die may receive additional commands/instructions from logic die 630. The DRAM dies may be coupled to each other using through silicon vias (TSVs) (e.g., TSVs 635 and 637) and bumps (e.g., 631 and 633). Alternate technologies, such as wafer-to-die bonding techniques may also be used. Logic die 630 may include a component (e.g., PHY 632) for high-speed communication between logic die 630 and at least one homogeneous chiplet.

With continued reference to FIG. 6, homogeneous chiplet 650 may also include a component (e.g., PHY 652) for high-speed communication with logic die 630. These components may be used to physically interconnect the logic die 630 with homogeneous chiplet 650 through interposer 620. HC 662 may be vertically stacked on top of HC 650. In this example, face-to-back coupling such as the one explained earlier with respect to HC 510 and HC 550 of FIG. 5 may be used. The face-to-back coupling allows for the vertical stacking of more than two homogeneous chiplets. HC 664 may be vertically stacked on top of HC 662. HC 662 and HC 664 may be interconnected using through silicon vias and hybrid bumps. In this example, face-to-back coupling such as the one explained earlier with respect to HC 510 and HC 550 of FIG. 5 may be used. HC 666 may be vertically stacked on top of HC 664. HC 664 and HC 666 may be interconnected using through silicon vias and hybrid bumps (e.g., hybrid bumps 661 and 663). In this example, face-to-back coupling such as the one explained earlier with respect to HC 510 and HC 550 of FIG. 5 may be used. Each homogeneous chiplet may also be through silicon via (TSV)-aware in that each such chiplet may include through silicon vias that can be exposed to enable attachment to another homogeneous chiplet. Thus, while HC 666 is not coupled using TSV 665 and TSV 667 to another homogeneous chiplet, the through silicon vias are present such that they could have been used, as such. As an example, the TSVs may be exposed by grinding or otherwise removing a layer of encapsulant and then using bumps or other interconnection structures to connect the chiplets. Although FIG. 6 shows a certain number of components of system 600 arranged in a certain manner, there could be more or fewer number of components arranged differently. As an example, additional homogeneous chiplets may be coupled using horizontal die-2-die interfaces. Similarly, although FIG. 6 shows an interposer for interconnecting the homogeneous chiplets and the high-bandwidth memory system, other interconnection arrangements may also be used.

In conclusion, the present disclosure relates to a homogeneous chiplet system comprising a first homogeneous chiplet including a first integrated circuit die having a first logic block and a first memory block interconnected using a first on-die interconnect structure to provide a first path for transfer of data signals between the first logic block and the first memory block. The homogeneous chiplet system may further include a second homogeneous chiplet including a second integrated circuit die having a second logic block and a second memory block interconnected using a second on-die interconnect structure to provide a second path for transfer of data signals between the second logic block and the second memory block, where the second homogeneous chiplet is stacked vertically on top of the first homogeneous chiplet, and where the first logic block and the second memory block are arranged in a manner such that a first set of vertical die-to-die interconnection structures coupling the first logic block and the second memory block are configured to provide a third path for transfer of data signals between the first logic block and the second memory block, and where the second logic block and the first memory block are arranged in a manner such that a second set of vertical die-to-die interconnection structures coupling the second logic block and the first memory block are configured to provide a fourth path for transfer of data signals between the second logic block and the first memory block.

The first path may have a first expected latency associated with the transfer of data signals between the first logic block and the first memory block, the third path may have a second expected latency associated with the transfer of data signals between the first logic block and the second memory block, and the first expected latency is greater than the second expected latency. The second path may have a first expected latency associated with the transfer of data signals between the second logic block and the second memory block, the fourth path a second expected latency associated with the transfer of data signals between the second logic block and the first memory block, and the first expected latency is greater than the second expected latency.

The first memory block may comprise a first 2-port static random access memory (SRAM) and the second memory block may comprise a second 2-port SRAM. The first homogeneous chiplet may further comprise a first memory interface for coupling the first homogeneous chiplet to a first memory external to the first homogeneous chiplet. The second homogeneous chiplet may further comprise a second memory interface for coupling the second homogeneous chiplet to a second memory external to the second homogeneous chiplet.

The first integrated circuit die may be configured such that the first integrated circuit die can be both vertically coupled to another integrated circuit die and horizontally coupled to a yet another integrated circuit die. The second integrated circuit die may be configured such that the second integrated circuit die can be both vertically coupled to another integrated circuit die and horizontally coupled to a yet another integrated circuit die.

In another example, the present disclosure relates to a homogeneous chiplet system comprising a first homogeneous chiplet including a first integrated circuit die having a first logic block and a first memory block interconnected using a first on-die interconnect structure to provide a first path for transfer of data signals between the first logic block and the first memory block. The homogeneous chiplet system may further include a second homogeneous chiplet including a second integrated circuit die having a second logic block and a second memory block interconnected using a second on-die interconnect structure to provide a second path for transfer of data signals between the second logic block and the second memory block, where the second homogeneous chiplet is stacked vertically on top of the first homogeneous chiplet, and where the first logic block and the second memory block are arranged in a manner such that a first set of vertical die-to-die interconnection structures coupling the first logic block and the second memory block are configured to provide a third path for transfer of data signals between the first logic block and the second memory block, and where the second logic block and the first memory block are arranged in a manner such that a second set of vertical die-to-die interconnection structures coupling the second logic block and the first memory block are configured to provide a fourth path for transfer of data signals between the second logic block and the first memory block.

The first path has a first expected latency associated with the transfer of data signals between the first logic block and the first memory block, where the third path has a second expected latency associated with the transfer of data signals between the first logic block and the second memory block, where the first expected latency is greater than the second expected latency, where the second path has a first expected latency associated with the transfer of data signals between the second logic block and the second memory block, where the fourth path has a second expected latency associated with the transfer of data signals between the second logic block and the first memory block, and where the first expected latency is greater than the second expected latency.

The first memory block may comprise a first 2-port static random access memory (SRAM) and the second memory block may comprise a second 2-port SRAM. The first homogeneous chiplet may further comprise a first memory interface for coupling the first homogeneous chiplet to a first memory external to the first homogeneous chiplet. The second homogeneous chiplet may further comprise a second memory interface for coupling the second homogeneous chiplet to a second memory external to the second homogeneous chiplet.

The first integrated circuit die may be configured such that the first integrated circuit die can be both vertically coupled to another integrated circuit die and horizontally coupled to a yet another integrated circuit die. The second integrated circuit die may be configured such that the second integrated circuit die can be both vertically coupled to another integrated circuit die and horizontally coupled to a yet another integrated circuit die.

In another example, the present disclosure relates to a homogeneous chiplet system comprising a first homogeneous chiplet including a first integrated circuit die having a first logic block and a first memory block interconnected using a first on-die interconnect structure to provide a first path for transfer of data signals between the first logic block and the first memory block. The homogeneous chiplet system may further include a second homogeneous chiplet including a second integrated circuit die having a second logic block and a second memory block interconnected using a second on-die interconnect structure to provide a second path for transfer of data signals between the second logic block and the second memory block, where the second homogeneous chiplet is stacked vertically on top of the first homogeneous chiplet, and where the first logic block and the second memory block are arranged in a manner such that a first set of vertical die-to-die interconnection structures coupling the first logic block and the second memory block are configured to provide a third path for transfer of data signals between the first logic block and the second memory block, and where the second logic block and the first memory block are arranged in a manner such that a second set of vertical die-to-die interconnection structures coupling the second logic block and the first memory block are configured to provide a fourth path for transfer of data signals between the second logic block and the first memory block.

The first path has a first expected latency associated with the transfer of data signals between the first logic block and the first memory block, where the third path has a second expected latency associated with the transfer of data signals between the first logic block and the second memory block, where the first expected latency is greater than the second expected latency, where the second path has a first expected latency associated with the transfer of data signals between the second logic block and the second memory block, where the fourth path has a second expected latency associated with the transfer of data signals between the second logic block and the first memory block, where the first expected latency is greater than the second expected latency. Each of the first homogeneous chiplet and second homogeneous chiplet is configured as a through silicon via (TSV)-aware chiplet allowing for both face-to-face and face-to-back coupling between the first homogeneous chiplet and second homogeneous chiplet.

The first memory block may comprise a first 2-port static random access memory (SRAM) and the second memory block may comprise a second 2-port SRAM. The first homogeneous chiplet may further comprise a first memory interface for coupling the first homogeneous chiplet to a first memory external to the first homogeneous chiplet. The second homogeneous chiplet may further comprise a second memory interface for coupling the second homogeneous chiplet to a second memory external to the second homogeneous chiplet.

The first integrated circuit die may be configured such that the first integrated circuit die can be both vertically coupled to another integrated circuit die and horizontally coupled to a yet another integrated circuit die. The second integrated circuit die may be configured such that the second integrated circuit die can be both vertically coupled to another integrated circuit die and horizontally coupled to a yet another integrated circuit die.

It is to be understood that the methods, modules, and components depicted herein are merely exemplary. Alternatively, or in addition, the functionality described herein can be performed, at least in part, by one or more hardware logic components. For example, and without limitation, illustrative types of hardware logic components that can be used include Field-Programmable Gate Arrays (FPGAs), Application-Specific Integrated Circuits (ASICs), Application-Specific Standard Products (ASSPs), System-on-a-Chip systems (SOCs), Complex Programmable Logic Devices (CPLDs), etc. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or inter-medial components. Likewise, any two components so associated can also be viewed as being "operably connected," or "coupled," to each other to achieve the desired functionality.

The functionality associated with some examples described in this disclosure can also include instructions stored in a non-transitory media. The term "non-transitory media" as used herein refers to any media storing data and/or instructions that cause a machine to operate in a specific manner. Exemplary non-transitory media include non-volatile media and/or volatile media. Non-volatile media include, for example, a hard disk, a solid state drive, a magnetic disk or tape, an optical disk or tape, a flash memory, an EPROM, NVRAM, PRAM, or other such media, or networked versions of such media. Volatile media include, for example, dynamic memory such as DRAM, SRAM, a cache, or other such media. Non-transitory media is distinct from, but can be used in conjunction with transmission media. Transmission media is used for transferring data and/or instruction to or from a machine. Exemplary transmission media, include coaxial cables, fiber-optic cables, copper wires, and wireless media, such as radio waves.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the disclosure provides specific examples, various modifications and changes can be made without departing from the scope of the disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to a specific example are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed:

1. A homogeneous chiplet system comprising:
   a first homogeneous chiplet including a first integrated circuit die having a first logic block and a first memory block interconnected using a first on-die interconnect structure to provide a first path for transfer of data signals between the first logic block and the first memory block; and
   a second homogeneous chiplet including a second integrated circuit die having a second logic block and a second memory block interconnected using a second on-die interconnect structure to provide a second path for transfer of data signals between the second logic block and the second memory block, wherein the second homogeneous chiplet is stacked vertically on top of the first homogeneous chiplet, and wherein the first logic block and the second memory block are arranged in a manner such that a first set of vertical die-to-die interconnection structures coupling the first logic block and the second memory block are configured to provide a third path for transfer of data signals between the first logic block and the second memory block, and wherein the second logic block and the first memory block are arranged in a manner such that a second set of vertical die-to-die interconnection structures coupling the second logic block and the first memory block are configured to provide a fourth path for transfer of data signals between the second logic block and the first memory block.

2. The homogeneous chiplet system of claim 1, wherein the first path has a first expected latency associated with the transfer of data signals between the first logic block and the first memory block, wherein the third path has a second expected latency associated with the transfer of data signals between the first logic block and the second memory block, and wherein the first expected latency is greater than the second expected latency.

3. The homogeneous chiplet system of claim 1, wherein the second path has a first expected latency associated with the transfer of data signals between the second logic block and the second memory block, wherein the fourth path has a second expected latency associated with the transfer of data signals between the second logic block and the first memory block, and wherein the first expected latency is greater than the second expected latency.

4. The homogeneous chiplet system of claim 1, wherein the first memory block comprises a first 2-port static random access memory (SRAM), and wherein the second memory block comprises a second 2-port SRAM.

5. The homogeneous chiplet system of claim 1, wherein the first homogeneous chiplet further comprises a first memory interface for coupling the first homogeneous chiplet to a first memory external to the first homogeneous chiplet.

6. The homogeneous chiplet system of claim 1, wherein the second homogeneous chiplet further comprises a second memory interface for coupling the second homogeneous chiplet to a second memory external to the second homogeneous chiplet.

7. The homogeneous chiplet system of claim 1, wherein the first integrated circuit die is configured such that the first integrated circuit die can be both vertically coupled to another integrated circuit die and horizontally coupled to a yet another integrated circuit die.

8. The homogeneous chiplet system of claim 1, wherein the second integrated circuit die is configured such that the second integrated circuit die can be both vertically coupled to another integrated circuit die and horizontally coupled to a yet another integrated circuit die.

9. A homogeneous chiplet system comprising:
a first homogeneous chiplet including a first integrated circuit die having a first logic block and a first memory block interconnected using a first on-die interconnect structure to provide a first path for transfer of data signals between the first logic block and the first memory block; and
a second homogeneous chiplet including a second integrated circuit die having a second logic block and a second memory block interconnected using a second on-die interconnect structure to provide a second path for transfer of data signals between the second logic block and the second memory block, wherein the second homogeneous chiplet is stacked vertically on top of the first homogeneous chiplet, and wherein the first logic block and the second memory block are arranged in a manner such that a first set of vertical die-to-die interconnection structures coupling the first logic block and the second memory block are configured to provide a third path for transfer of data signals between the first logic block and the second memory block, and wherein the second logic block and the first memory block are arranged in a manner such that a second set of vertical die-to-die interconnection structures coupling the second logic block and the first memory block are configured to provide a fourth path for transfer of data signals between the second logic block and the first memory block, wherein the first path has a first expected latency associated with the transfer of data signals between the first logic block and the first memory block, wherein the third path has a second expected latency associated with the transfer of data signals between the first logic block and the second memory block, wherein the first expected latency is greater than the second expected latency, wherein the second path has a first expected latency associated with the transfer of data signals between the second logic block and the second memory block, wherein the fourth path has a second expected latency associated with the transfer of data signals between the second logic block and the first memory block, and wherein the first expected latency is greater than the second expected latency.

10. The homogeneous chiplet system of claim 9, wherein the first memory block comprises a first 2-port static random access memory (SRAM), and wherein the second memory block comprises a second 2-port SRAM.

11. The homogeneous chiplet system of claim 9, wherein the first homogeneous chiplet further comprises a first memory interface for coupling the first homogeneous chiplet to a first memory external to the first homogeneous chiplet.

12. The homogeneous chiplet system of claim 9, wherein the second homogeneous chiplet further comprises a second memory interface for coupling the second homogeneous chiplet to a second memory external to the second homogeneous chiplet.

13. The homogeneous chiplet system of claim 9, wherein the first integrated circuit die is configured such that the first integrated circuit die can be both vertically coupled to another integrated circuit die and horizontally coupled to a yet another integrated circuit die.

14. The homogeneous chiplet system of claim 9, wherein the second integrated circuit die is configured such that the second integrated circuit die can be both vertically coupled to another integrated circuit die and horizontally coupled to a yet another integrated circuit die.

15. A homogeneous chiplet system comprising:
a first homogeneous chiplet including a first integrated circuit die having a first logic block and a first memory block interconnected using a first on-die interconnect structure to provide a first path for transfer of data signals between the first logic block and the first memory block; and
a second homogeneous chiplet including a second integrated circuit die having a second logic block and a second memory block interconnected using a second on-die interconnect structure to provide a second path for transfer of data signals between the second logic block and the second memory block, wherein the second homogeneous chiplet is stacked vertically on top of the first homogeneous chiplet, and wherein the first logic block and the second memory block are arranged in a manner such that a first set of vertical die-to-die interconnection structures coupling the first logic block and the second memory block are configured to provide a third path for transfer of data signals between the first logic block and the second memory block, and wherein the second logic block and the first memory block are arranged in a manner such that a second set of vertical die-to-die interconnection structures coupling the second logic block and the first memory block are configured to provide a fourth path for transfer of data signals between the second logic block and the first memory block, wherein the first path has a first expected latency associated with the transfer of data signals between the first logic block and the first memory block, wherein the third path has a second expected latency associated with the transfer of data signals between the first logic block and the second memory block, wherein the first expected latency is greater than the second expected latency, wherein the second path has a first expected latency associated with the transfer of data signals between the second logic block and the second memory block, wherein the fourth path has a second expected latency associated with the transfer of data signals between the second logic block and the first memory block, wherein the first expected latency is greater than the second expected latency, wherein each of the first homogeneous chiplet and second homogeneous chiplet is configured as a through silicon via (TSV)-aware chiplet allowing for both face-to-face and face-to-back coupling between the first homogeneous chiplet and second homogeneous chiplet.

16. The homogeneous chiplet system of claim 15, wherein the first memory block comprises a first 2-port static random access memory (SRAM), and wherein the second memory block comprises a second 2-port SRAM.

17. The homogeneous chiplet system of claim 16, wherein the first homogeneous chiplet further comprises a first memory interface for coupling the first homogeneous chiplet to a first memory external to the first homogeneous chiplet.

18. The homogeneous chiplet system of claim 17, wherein the second homogeneous chiplet further comprises a second memory interface for coupling the second homogeneous chiplet to a second memory external to the second homogeneous chiplet.

19. The homogeneous chiplet system of claim 15, wherein the first integrated circuit die is configured such that the first integrated circuit die can be both vertically coupled to another integrated circuit die and horizontally coupled to a yet another integrated circuit die.

20. The homogeneous chiplet system of claim 15, wherein the second integrated circuit die is configured such that the second integrated circuit die can be both vertically coupled to another integrated circuit die and horizontally coupled to a yet another integrated circuit die.

* * * * *